(12) United States Patent
Hellberg

(10) Patent No.: US 10,116,265 B2
(45) Date of Patent: Oct. 30, 2018

(54) MODULAR AND SCALABLE POWER AMPLIFIER SYSTEM

(71) Applicant: TELEFONAKTIEBOLAGET LM ERICSSON (PUBL), Stockholm (SE)

(72) Inventor: Richard Hellberg, Huddinge (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 320 days.

(21) Appl. No.: 15/102,808

(22) PCT Filed: Apr. 11, 2016

(86) PCT No.: PCT/SE2016/050300
§ 371 (c)(1),
(2) Date: Jun. 8, 2016

(87) PCT Pub. No.: WO2017/180028
PCT Pub. Date: Oct. 19, 2017

(65) Prior Publication Data
US 2018/0102743 A1    Apr. 12, 2018

(51) Int. Cl.
*H03F 1/02*    (2006.01)
*H03F 3/195*    (2006.01)
(Continued)

(52) U.S. Cl.
CPC ........... *H03F 1/0277* (2013.01); *H03F 3/195* (2013.01); *H03F 3/245* (2013.01); *H03F 3/602* (2013.01);
(Continued)

(58) Field of Classification Search
CPC .................................................. H03F 1/0277
See application file for complete search history.

(56) References Cited

U.S. PATENT DOCUMENTS

| 4,853,649 A | * | 8/1989 | Seino | ................... H01L 27/0605 |
| | | | | 257/E27.012 |
| 5,136,300 A | * | 8/1992 | Clarke | .................... G01S 7/032 |
| | | | | 342/175 |

(Continued)

FOREIGN PATENT DOCUMENTS

| EP | 1017171 A1 | 7/2000 |
| EP | 1274165 A1 | 1/2003 |

(Continued)

OTHER PUBLICATIONS

Chireix, High Power Outphasing Modulation, Proceedings of the Institute of Radio Engineers, vol. 23, No. 11, Nov. 1935.

(Continued)

*Primary Examiner* — Patricia T Nguyen

(57) ABSTRACT

A modular power amplifier system and an electronic device comprising the modular power amplifier system in which, the modular power amplifier system comprises a plurality of amplifier modules. The plurality of amplifier modules are arranged into a number of sections comprising a first section which comprises a first amplifier module configured to receive the input signal within a first amplitude range and provide an output signal having a first output power; a second section which comprises a second amplifier module configured to receive the input signal within a second amplitude range and provide an output signal having a second output power; and an i-th section which comprises multiple amplifier modules, each being configured to receive the input signal within a certain amplitude range and provide an output signal having a certain output power. The output signals of the amplifier modules are combined to provide output signals with scalable output power.

14 Claims, 10 Drawing Sheets

(51) Int. Cl.
  *H03F 3/24* (2006.01)
  *H03F 3/60* (2006.01)
(52) U.S. Cl.
  CPC ....... *H03F 3/605* (2013.01); *H03F 2200/255* (2013.01); *H03F 2200/432* (2013.01); *H03F 2200/451* (2013.01); *H03F 2200/516* (2013.01)

(56) References Cited

U.S. PATENT DOCUMENTS

| | | | |
|---|---|---|---|
| 6,639,463 B1 * | 10/2003 | Ghanadan | H03F 3/602 330/124 R |
| 2003/0034838 A1 * | 2/2003 | Fanous | H03F 3/45183 330/129 |
| 2004/0041632 A1 * | 3/2004 | Ouacha | H01P 5/04 330/295 |
| 2004/0066352 A1 * | 4/2004 | Hoppenstein | H01Q 23/00 343/853 |
| 2009/0309659 A1 | 12/2009 | Lender, Jr. et al. | |
| 2010/0117726 A1 * | 5/2010 | Okubo | H03F 1/0288 330/124 R |

FOREIGN PATENT DOCUMENTS

| | | |
|---|---|---|
| EP | 1671418 A1 | 6/2006 |
| WO | 2015171027 A1 | 11/2015 |
| WO | 2016056952 A1 | 4/2016 |
| WO | 2016056953 A1 | 4/2016 |
| WO | 2016182485 A1 | 11/2016 |
| WO | 2017074229 A1 | 5/2017 |

OTHER PUBLICATIONS

Doherty, A New High Efficiency Power Amplifier for Modulated Waves, Proceedings of the Institute of Radio Engineers, vol. 24, No. 9, Sep. 1936.

Chen, et al., Design and Analysis of a Stage-Scaled Distributed Power Amplifier, IEEE Transactions on Microwave Theory and Techniques, vol. 59, No. 5, pp. 1274-1283, May 2011.

Levy, et al., A 6-41 GHz Distributed Amplifier with Supply Scaling for Efficiency Enhancement, 2015 IEEE Compound Semiconductor Integrated Circuit Symposium (CSICS), pp. 1-4, Oct. 11, 2015.

* cited by examiner

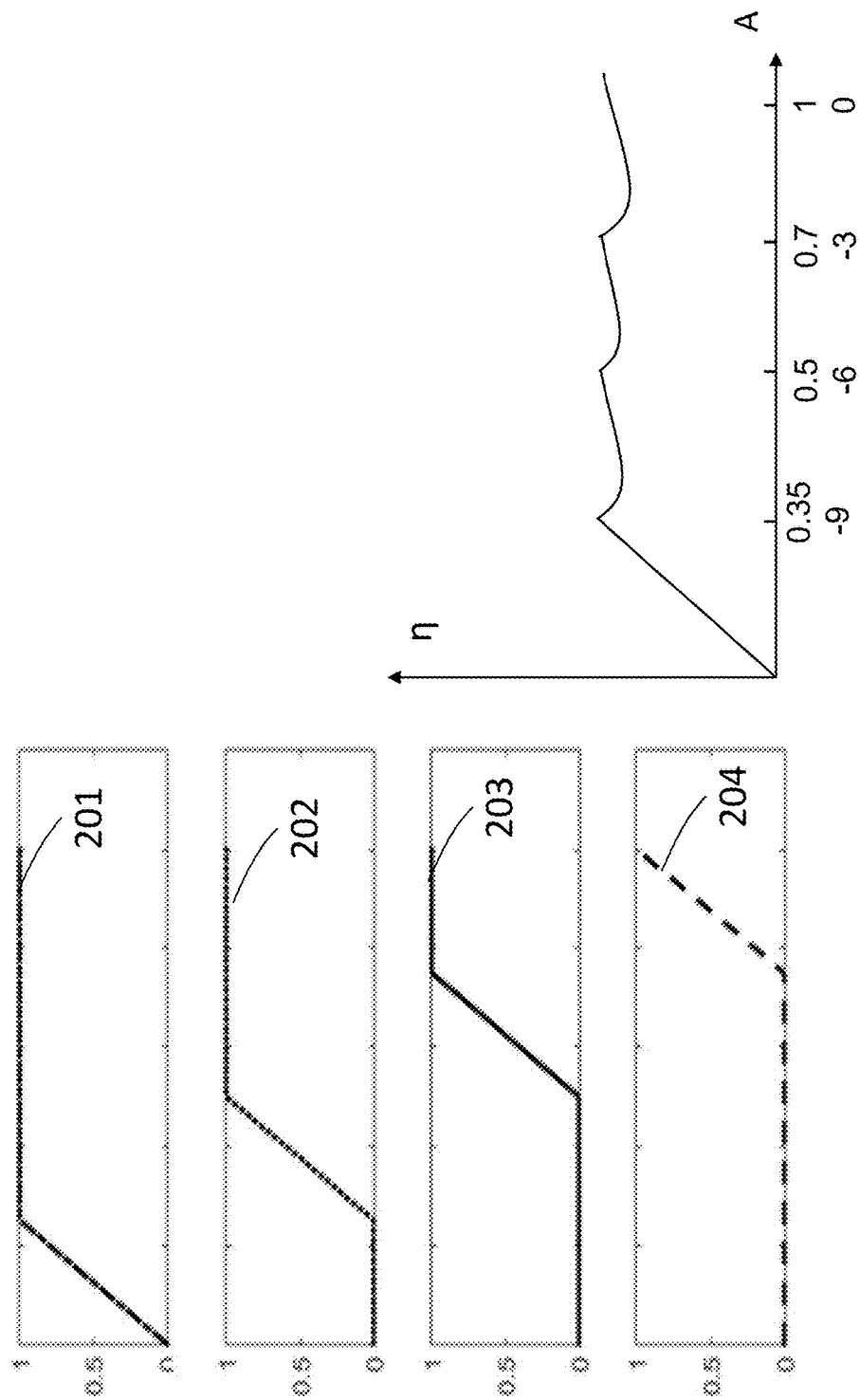

MODULAR AND SCALABLE POWER AMPLIFIER SYSTEM

This application is a 371 of International Application No. PCT/SE2016/050300, filed Apr. 11, 2016, the disclosure of which is fully incorporated herein by reference.

TECHNICAL FIELD

Embodiments herein relate to a modular power amplifier system for amplification of an input signal into an output signal with scalable power. In particular, a modular power amplifier system comprising a plurality of amplifier modules arranged in different sections and an electronic device comprising the modular power amplifier system are disclosed.

BACKGROUND

Power amplifiers are widely used for example in radio base stations and user equipments in wireless communication systems. Power amplifiers typically amplify an input signal of high frequency into an output signal ready for radio transmission. High efficiency is generally desirable for power amplifier design to reduce the amount of power consumed.

The maximum output power from an amplifier chip, for example a Monolithic Microwave Integrated Circuit (MMIC) or Radio Frequency Integrated Circuit (RFIC), is limited by several factors. For example, there is a maximum safe temperature that limits the average power dissipation and there are voltage and current limitations on the transistors that limit the maximum or peak output power.

Generally, a Radio Frequency (RF) power amplifier can be driven in a so called backed off operation. This means that the power amplifier is operated at a certain level, e.g. expressed as a number of decibels (dBs), under its maximum output power. Backed off operation may also refer to that an instantaneous output power is relatively low. When discussing operation of a power amplifier, the term "transition point" is generally used, which means that at a certain amplitude point, i.e. the transition point, some significant changes occur in the power amplifier, for example operating mode, number of active sub-amplifiers etc. In some amplifiers such as Doherty type, the transition points are also high-efficiency points in an efficiency curve.

To achieve higher output power one can combine power from several chips. Many well-known RF power combination techniques with different properties are available, for example paralleling, Wilkinson combiners, hybrids or directional couplers, bridge coupling, radial combiners and spatial combiners.

The pure combination techniques have a property that the efficiency curve over input signal amplitude has the same shape as the efficiency curve of the employed chips or subsystems since the individual chips are just combined. Therefore, for efficient operation at backed off operations all combined chips or modules need to have the same shape of the efficiency curve.

Another class of combination networks, e.g. networks in Doherty type amplifier disclosed in "A new high efficiency power amplifier for modulated waves," Proc. IRE, vol. 24, no. 9, pp. 1163-1182, September 1936, and Chireix type power amplifier disclosed in "High power outphasing modulation", Proc. IRE, vol. 23, no. 2, pp. 1370-1392, November 1935, provide specific interactions between transistor outputs to increase efficiency at lower input signal amplitudes. The interactions are such that they allow some RF output currents to be kept very low while operating at low output amplitudes, while some RF output voltages are instead allowed to increase. The lowered RF output currents means that, for the same output power, less DC current is used in the chips, thus efficiency is increased.

A problem with using Doherty/Chireix-type combination/interaction networks is that the structures and transistor size relations are generally different depending on the efficiency requirements at backed off operations. The bandwidth, which is usually not very large even in the best case, also changes with the structure and backed off efficiency requirements. Optimal efficiency curves usually calls for many different transistor sizes.

For Doherty/Chireix-type combination/interaction networks, the selection of combination methods for chips in the individual high-power transistors is very limited. In essence only pure paralleling, Wilkinson and 180 degrees paralleling is used. For combining the outputs of several complete Doherty/Chireix-type amplifiers, a full range of combination method is available, but sometimes large phase variations between amplifiers may require extra means of adjustment. Further, the bandwidth is also generally lower and/or the ripple on the output signal is higher.

New kind of amplifiers with very large bandwidths, low ripple, and high efficiency over wide input signal amplitude ranges have emerged and have been implemented on chips, e.g. the amplifiers disclosed in patent applications PCT/SE2015/050529 and PCT/SE2015/051134 filed by the present applicant. When using them at higher powers than that can be provided by a single chip, power combination must also be used. The pure combination methods have the problem mentioned above, that is all chips or modules must have good efficiency over entire input signal amplitude range. If good efficiency at backed off operation is required, it will not be improved by the combination process. Each module or integrated amplifier of the new kind would then have to have good efficiency at backed off operations in order for the combined system to have that property. This can be difficult or inconvenient for a number of reasons. For example, there will typically be a very large difference between the highest and lowest impedance level for on-chip transmission lines used in the modules or integrated amplifiers. The total length of transmission line, which increases with bandwidth, may also be larger than what is practical on a single chip.

SUMMARY

Therefore, an object of embodiments herein is to provide a power amplifier system with improved power addition and combination in respect of bandwidth and efficiency.

According to an aspect, the object is achieved by a modular power amplifier system for receiving an input signal and providing output signals with scalable output power. The modular power amplifier system comprises a plurality of amplifier modules; each amplifier module comprises an input port and an output port. The plurality of amplifier modules is arranged into a number of sections. The number of sections comprises:

a first section which comprises a first amplifier module, among the plurality of amplifier modules, configured to receive the input signal within a first amplitude range and provide an output signal having a first output power, P1;

a second section which comprises a second amplifier module, among the plurality of amplifier modules, configured to receive the input signal within a second amplitude range and provide an output signal having a second output power, P2; and an i-th section which comprises multiple amplifier modules, among the plurality of amplifier modules, each being configured to receive the input signal within a certain amplitude range and provide an output signal having a certain output power, Pi.

The output signal of the first amplifier module is combined with the output signal of the second amplifier module (121) and the output signal of each amplifier module in the (i−1)-th section is split and each split output signal is combined with the respective output signal of the amplifier modules in the i-th section, where i=3, 4, . . . .

According to the embodiments herein, the modular power amplifier system comprises plurality of amplifier modules. Each amplifier module performs power amplification within a certain amplitude range. The amplifier modules may have a maximum incoming power P from a previous section to be combined with and provide a maximum output power of a small integer times P. The small integer determines the ratio between the upper and lower edge of the input signal amplitude range.

According to the embodiments herein, two different amplification functions are provided. The first section which comprises a first amplifier module functions as a "seed" part that provides an output power for the lowest input signal amplitude range, e.g. from zero to P1. The second and further sections are "power-add" parts, that perform efficient power addition and combination for higher input signal amplitude ranges. The output power of each amplifier module in one section is split into parts of its maximum output power to serve as an incoming power to be combined with the output power of the amplifier modules in the next section.

Therefore, according to the embodiments herein, a building system for wideband amplifiers is provided which is modular and scalable in output power and has high efficiency in backed off operation ranges. Using this building system, a plurality of amplifier modules can be connected in expanding patterns to achieve desired output power. The range of characteristic output impedance within each amplifier module may be reduced because the difference between the highest and lowest impedance level for an on-chip output transmission line of each amplifier module is lower for a single section than for a succession. The modular power amplifier system may also retain the large bandwidth of the individual amplifier modules without any extra design effort.

Therefore the modular power amplifier system according to embodiments herein provides improved power addition and combination in respect of bandwidth and efficiency.

BRIEF DESCRIPTION OF THE DRAWINGS

The various aspects of embodiments disclosed herein, including particular features and advantages thereof, will be readily understood from the following detailed description and the accompanying drawings, in which:

FIG. 2c is a diagram illustrating operating curves for the modular power amplifier system shown in FIG. 2a, FIG. 2b is a diagram illustrating efficiency curve for the modular power amplifier system shown in FIG. 2a, FIG. 3 is a schematic block diagram illustrating a second example of a modular power amplifier system according to embodiments herein.

DETAILED DESCRIPTION

Figure 1A:
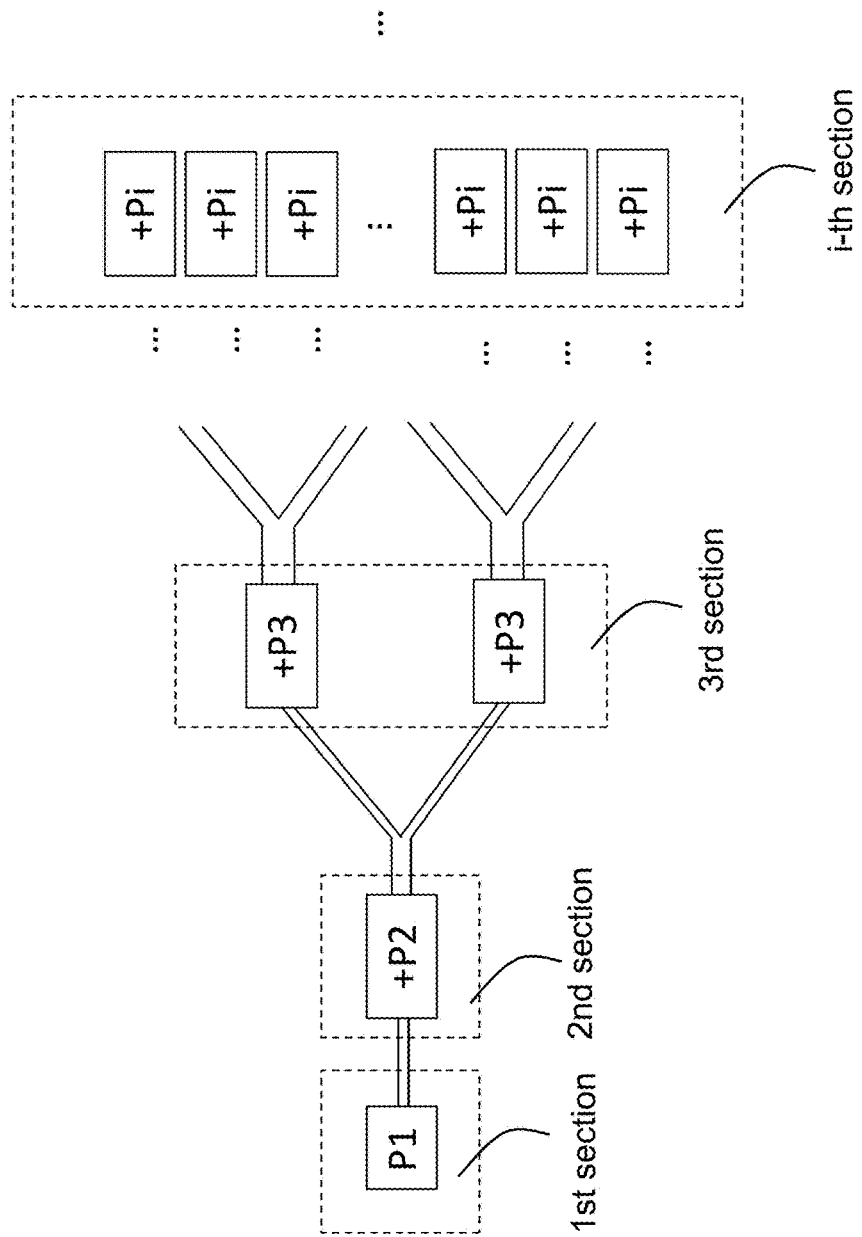
FIG. 1a is a schematic block diagram illustrating a power flow of a modular power amplifier system according to embodiments herein.

Throughout the following description similar reference numerals have been used to denote similar features, such as elements, units, modules, circuits, nodes, parts, items or the like, when applicable.

To illustrate the power addition and combination concept according to the embodiments herein, a power flow chart for a modular power amplifier system is shown in FIG. 1a. The modular power amplifier system comprises a plurality of amplifier modules arranged into different sections, e.g. $1^{st}$ to i-th section, and connected in expanding patterns. Each amplifier module performs power amplification within a certain amplitude range and provides an output power of P1, P2, P3, . . . Pi respectively. The output power from the amplifier modules in one section serves as an incoming power to the next section and combined with the output power of the amplifier modules in the next section. Therefore each of the amplifier modules may have a maximum incoming power P from a previous section to be combined with and provide a maximum output power of a small integer times P. That is the power ratio between different amplifier modules, i.e. P2/P1, P3/P2 . . . may be any integer.

Figure 1B:
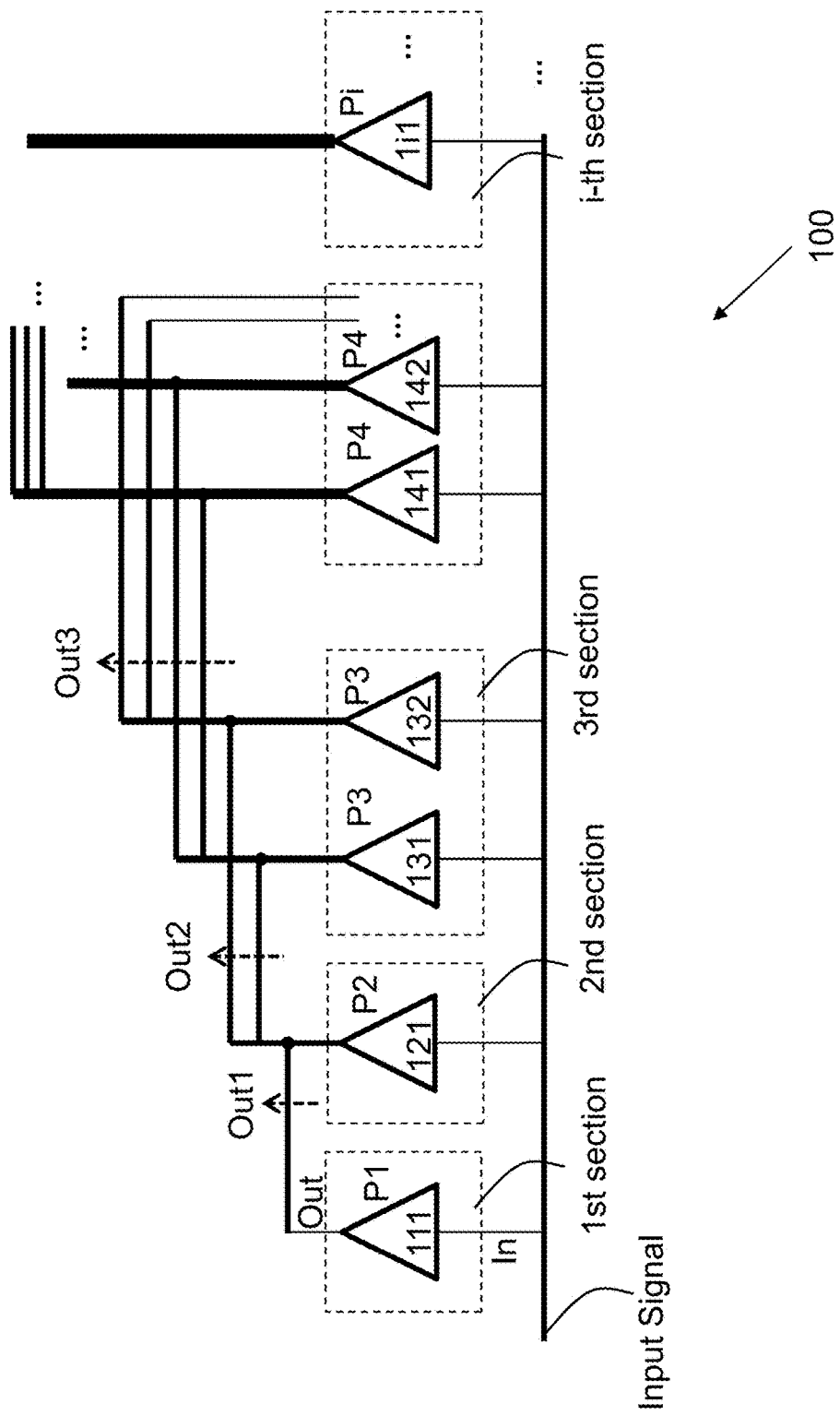
FIG. 1b is a schematic block diagram illustrating a modular power amplifier system according to embodiments herein.

FIG. 1b illustrates a modular power amplifier system 100 for amplifying an input signal into output signals with scalable output power according to the power addition and combination concept described above. The modular power amplifier system 100 comprises a plurality of amplifier modules 111, 121, 131, 132, 141 . . . 1i1, wherein each amplifier module comprises an input port In and an output port Out, and wherein the plurality of amplifier modules are arranged into a number of sections, 1st, 2nd, 3rd . . . and i-th sections. The first section comprises a first amplifier module 111, among the plurality of amplifier modules, which is configured to receive the input signal within a first amplitude range and to provide an output signal having a first output power P1. The second section comprises a second amplifier module 121, among the plurality of amplifier modules, which is configured to receive the input signal within a second amplitude range and to provide an output signal having a second output power P2 . . . . The i-th section comprises multiple amplifier modules 1i1, 1i2, . . . , among the plurality of amplifier modules, each being configured to receive the input signal within a certain amplitude range and to provide an output signal having a certain output power Pi.

The output powers from the amplifier modules in different sections are combined in this way: the output signal of the first amplifier module 111 in the first section is combined with the output signal of the second amplifier module 121 in the 2nd section, the output signal of each amplifier module in the (i−1)-th section is split and each split output signal is combined with the respective output signal of the amplifier module in the i-th section, wherein i=3, 4, . . . . In other words, the output power of each amplifier module in one section, e.g. 2nd or 3rd . . . section is split into parts of its maximum output power to serve as an incoming power to be combined with the output power of the amplifier modules in the next section.

For example, the output power from the 1st section is P1, i.e. OutP1=P1. The output signal of the first amplifier module 111 in the 1st section is combined with the output signal of the second amplifier module 121 in the 2nd section and gives a total output power of P1+P2 at the output port of the second amplifier module 121. Then the total output power provided by the 2nd section is OutP2=P1+P2. The output signal of each amplifier module 121 in the 2nd section is split and each split output signal, with power of (P1+P2)/2, is combined with the respective output signal of the amplifier module 131, 132 in the 3rd section and gives a total output power of (P1+P2)/2+P3 at the output port of each amplifier module 131, 132. Then the total output power provided by the 3rd section is OutP3=(P1+P2)/2+P3+(P1+P2)/2+P3=P1+P2+2*P3.

It can be seen that two different amplification functions may be provided. A "seed" part, e.g. the first amplifier module 111, that provides output power for the lowest input signal amplitude range, e.g. from zero output power to a maximum output power of P1 and "power-add" parts, e.g. the amplifier modules 121, 131, 132 . . . that add power for specific higher amplitude ranges.

The "seed" part, i.e. the first amplifier module 111 that provides the first portion of output power for the power-add modules to build on, can be any amplifier capable of providing an RF signal having sufficient power of P. This is due to the directional property of the power-add modules. The seed amplifier module 111 should preferably have sufficient bandwidth to match the rest of the power amplifier system. The power-add amplifier modules, e.g. 121, 131-132, 1i1 . . . , may be integrated chips, then the seed amplifier module 111 may have to be built as an integrated chip as well.

There are several ways of avoiding having a special circuit or chip for the seed part, one way is to reuse a chip made for some other purpose, for example drive signal amplification. Another way is to reuse a power-add module.

Therefore according to some embodiments herein, the first amplifier module 111, i.e. the seed part, may be any available amplifier modules, or any available power amplifier chips which are on the market, with the required output power that has a sufficient bandwidth capability.

To avoid increased number of different types of amplifier module used, according to some embodiments herein, the amplifier modules in different sections may be of a same type power amplifier modules or chips, or the second amplifier module 121 in the second section may be of a same type as the first amplifier module 111 in the first section, or the amplifier module in the i-th section is of a same type as the amplifier module in a previous section.

To further illustrate the power addition and combination techniques according to the embodiments herein, and their functions, features, advantages, the modular power amplifier system 100 will be discussed in detail with reference to different examples and implementations which all originates from the modular power amplifier system 100 as shown in FIG. 1b.

Figure 2A:
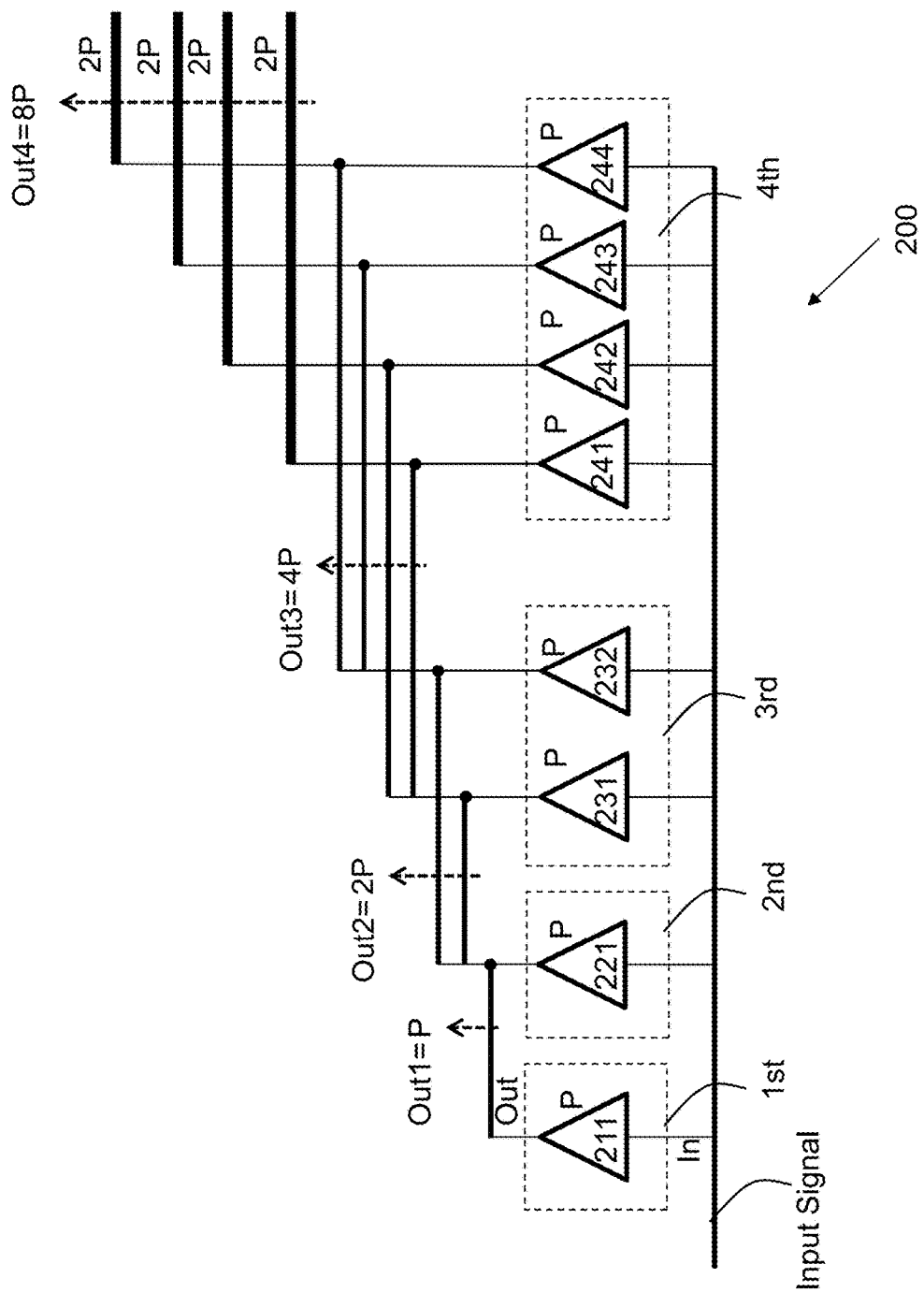
FIG. 2a is a schematic block diagram illustrating a first example of a modular power amplifier system according to embodiments herein.

As a first example, a modular power amplifier system 200 is shown in FIG. 2a. FIG. 2b shows an operating curve of the amplifier modules in different sections and FIG. 2c shows the efficiency curve of the modular power amplifier system 200.

The modular power amplifier system 200 comprises a plurality of amplifier modules 211, 221, 231, 232, 241, 242, 243, 244 and may be arranged into $1^{st}$, $3^{rd}$ and 4th sections. The first amplifier module 211 in the first section is a "seed" module that amplifies the input signal in the lowest input signal amplitude range, seen in FIG. 2b, curve 201, up to an output power of P, the total output power from the $1^{st}$ section is thus P, Out1=P. The efficiency of the first amplifier module 211 is generally increasing with increasing input signal amplitude, as seen in FIG. 2c, the first part of the efficiency curve, in this case from 0 to 0.35 of the maximum input signal amplitude. The first amplifier module 211 is therefore operating with backed off operation, e.g. 9 dB backed off from the maximum output power.

The next module, i.e. the second module 221 is a "power-add" module that adds its output signal on top of the output signal coming in from the first module 211, up to an output power of 2*P. Thus, the total output power from the 2nd section is 2*P, Out2=2P. The maximum power added is P, which can only be achieved when the incoming power from the first amplifier module is P, i.e. the output signal amplitude is at maximum from the previous section. The increase in power is thus 3 dB, and the efficiency is again at the maximum at the upper edge of the input signal amplitude range, e.g. at 0.5 of the maximum input signal amplitude. The 2*P maximum output power from the $2^{nd}$ section is split into two paths, each has a power of P and serves as the "seed" for the power-add modules, i.e. the amplifier module 131, 132 in the next section, the $3^{rd}$ section. The two amplifier modules in this section each adds its output signal on top of that coming in from the previous section, i.e. the $2^{nd}$ section, up to a power of 2*P, which means that the total output power from this section is 4*P, Out3=4P, again an increase of 3 dB in output power. Each of these outputs is split into two paths with a maximum power of P in each, that serve as the seeds for the power-add modules, the amplifier module 241, 242, 242, 244 in the final section, i.e. the $4^{th}$ section. The four amplifier modules in this section each add its output signal on top of that coming in from the previous section, i.e. the $3^{rd}$ section, to a maximum power of 2*P, which means that the maximum output power from this section is 8*P, Out4=8P. The four outputs may be combined into a lower number, for example one, by using conventional combining methods.

The modularity of the modular power amplifier system 100, 200 can be seen e.g. in FIG. 2a. That is, each additional section works in exactly the same way as the previous section, adding signal and power in an amplitude range on top of what the previous section provided. The operating curves, shown in FIG. 2b, illustrate this behavior: their maximum output signal amplitudes are equal and they increase linearly with the input signal amplitude within different input signal amplitude ranges. Since the power relations between the sections are equal, each providing a doubling of the maximum output power, the power ratios between the upper limit and lower limit of each input signal amplitude range, except for the first input signal amplitude range, are also equal, i.e. 3 dB. The power is added with the highest efficiency when the maximum power is added. The efficiency curve at backed off operation is thus also modularized in parts of 3 dB, with efficiency peaks at the upper limit of each input signal amplitude range, e.g. at −9 dB, −6 dB, −3 dB and 0 dB, respectively as shown in FIG. 2c.

In FIG. 2a, the amplifier module 221, 231, 232, 241-244 has the same power of P as the first amplifier module 211, and each one may be a monolithic chip. So the same type of amplifier module may be reused in the modular power amplifier system 200. Therefore, according to some embodiments herein, each amplifier module 211, 221, 231, 232, 241-244 in different sections may be a unity module which has same characteristic and output power and is implemented on a chip for operating in a certain frequency range.

According to some embodiments herein, the amplifier module in the first section is a first type of power amplifier chip and amplifier modules in other sections are a second type of power amplifier chip.

Figure 3:
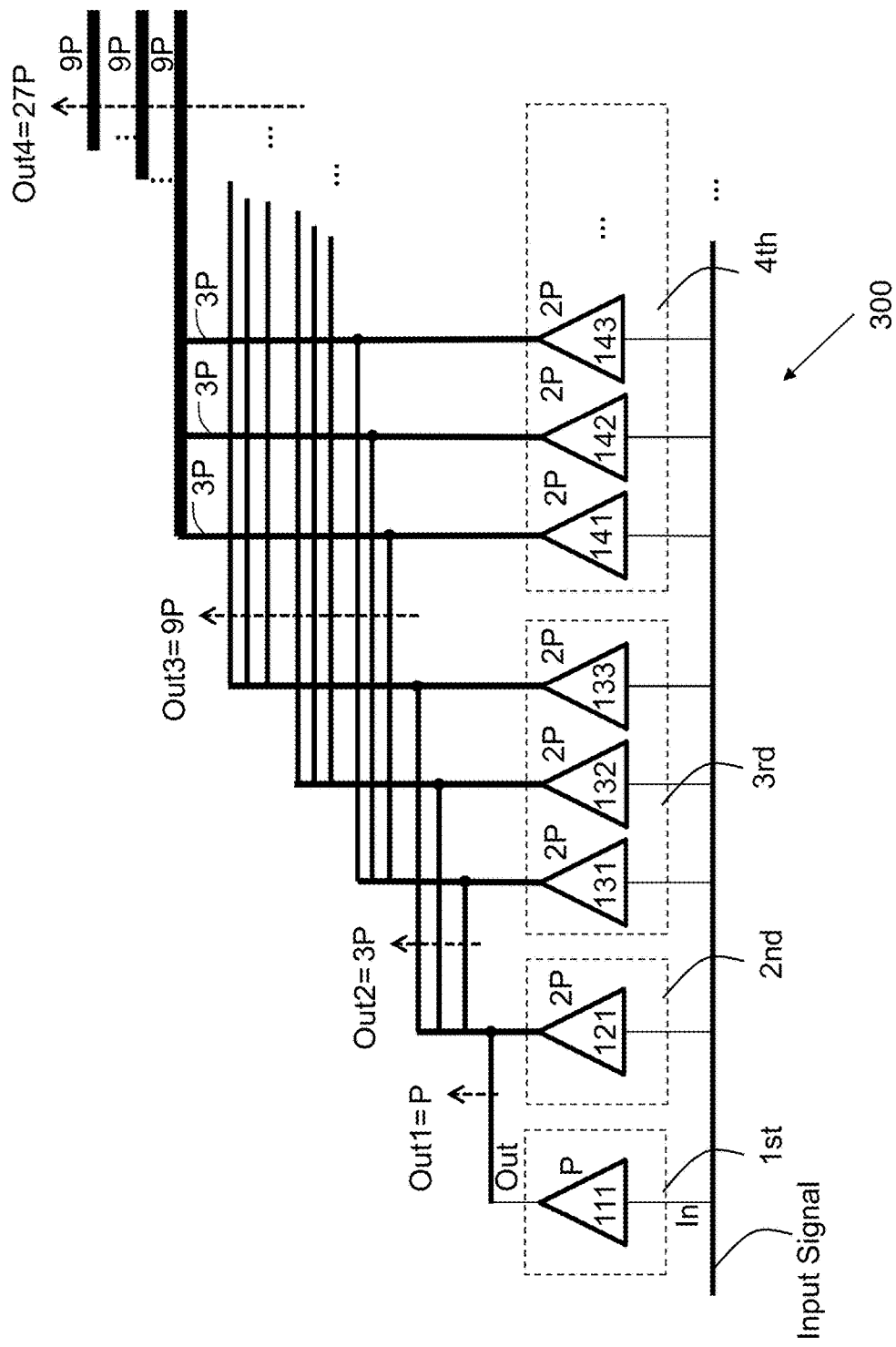

To illustrate this, a second example according to embodiments herein is shown in FIG. 3. In this embodiment, the first amplifier module 311 is a first type of power amplifier chip which has an output power of P. The other amplifier modules 321, 331-333, 341 . . . are a second type of power amplifier chip, each has an output power of 2P. The amplifier modules in the $2^{nd}$, $3^{rd}$ and $4^{th}$ sections each add maximally 2P to an incoming signal with maximum power of P from the previous section, i.e. they have a 3:1 relation of outgoing to incoming maximum power.

The maximum total output power provided by each section is Out1=P, Out2=3P, Out3=9P and Out4=27P, respectively. The 3:1 relation in power between the maximum total output powers of the sections means that the input signal amplitude ranges of the sections are 4.77 dB each. The efficiency curve at backed off amplitudes operations has efficiency peaks at the upper limit of each input signal amplitude range, i.e. at 0 dB, −4.77 dB, −9.54 dB and −14.3 dB from the maximum output power. The input signal amplitude range below −14.3 dB, i.e. up to an output power of P, is handled by the first module 111.

Figure 4:
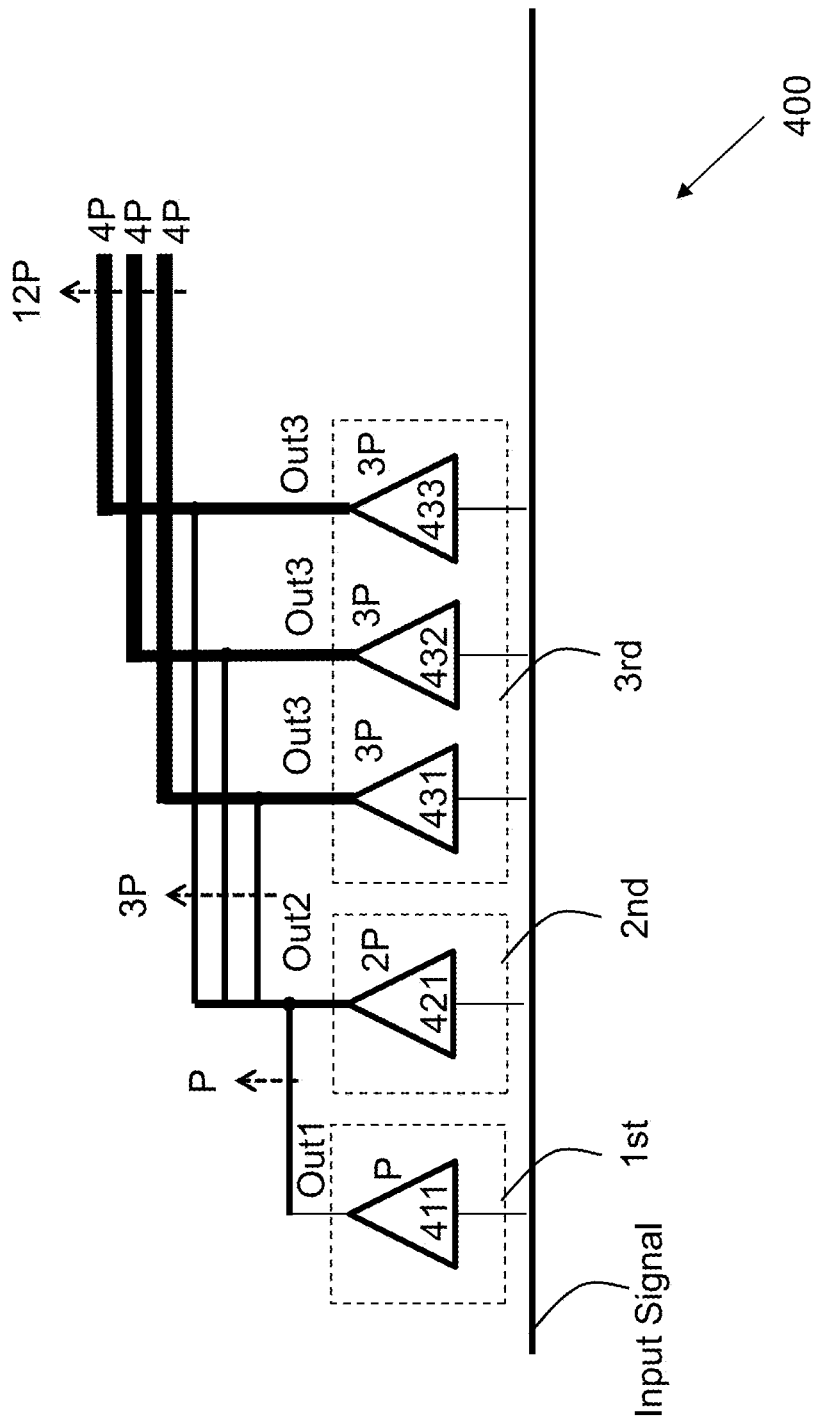
FIG. 4 is a schematic block diagram illustrating a third example of a modular power amplifier system according to embodiments herein.

According to some embodiments herein, the amplifier modules in different sections may be different types of power amplifier chips. That is different types of power-add modules can be combined. The maximum outgoing power from each module is then split into different numbers of parts in different sections. An example is shown in FIG. 4. In this embodiment, the first amplifier module 411 is a first type of power amplifier chip which has an output power of P, so Out1=P. The second amplifier module 421 is a second type of power amplifier chip, has an output power of 2P, and will add a power of 2P to the incoming power of P from the first section, so the total output power from the $2^{nd}$ section will be Out2=3P. The output signal from the second amplifier module 421 is split into 3 signals; each has a power of P and will be combined with the respective output signal of the amplifier modules 431,432, 433 in the $3^{rd}$ section. The amplifier modules 431,432, 433 are a third type of power amplifier chip, each adds maximally 3P to the incoming signal with a maximum power of P from the previous section. The output power from each of the amplifier modules 431,432, 433 is thus 4P, i.e. they have a 4:1 relation of outgoing to incoming maximum power. The power range of the amplifier modules 431,432, 433 in the $3^{rd}$ section is thus 6 dB, so the efficiency peaks will be at 0 dB, −6 dB and −10.8 dB from the maximum output power. The maximum total output power provided by the $3^{rd}$ section will be Out3=12P when the outputs from the amplifier modules 431-433 are combined.

The outputs from the amplifier modules in the last section may be combined into a single output by using conventional combining methods. A higher number of outputs can instead be useful for feeding to an antenna array, possibly with phase shifting circuits in the antenna feed lines. In this case groups of the outputs can be combined to a required number.

Figure 5A:
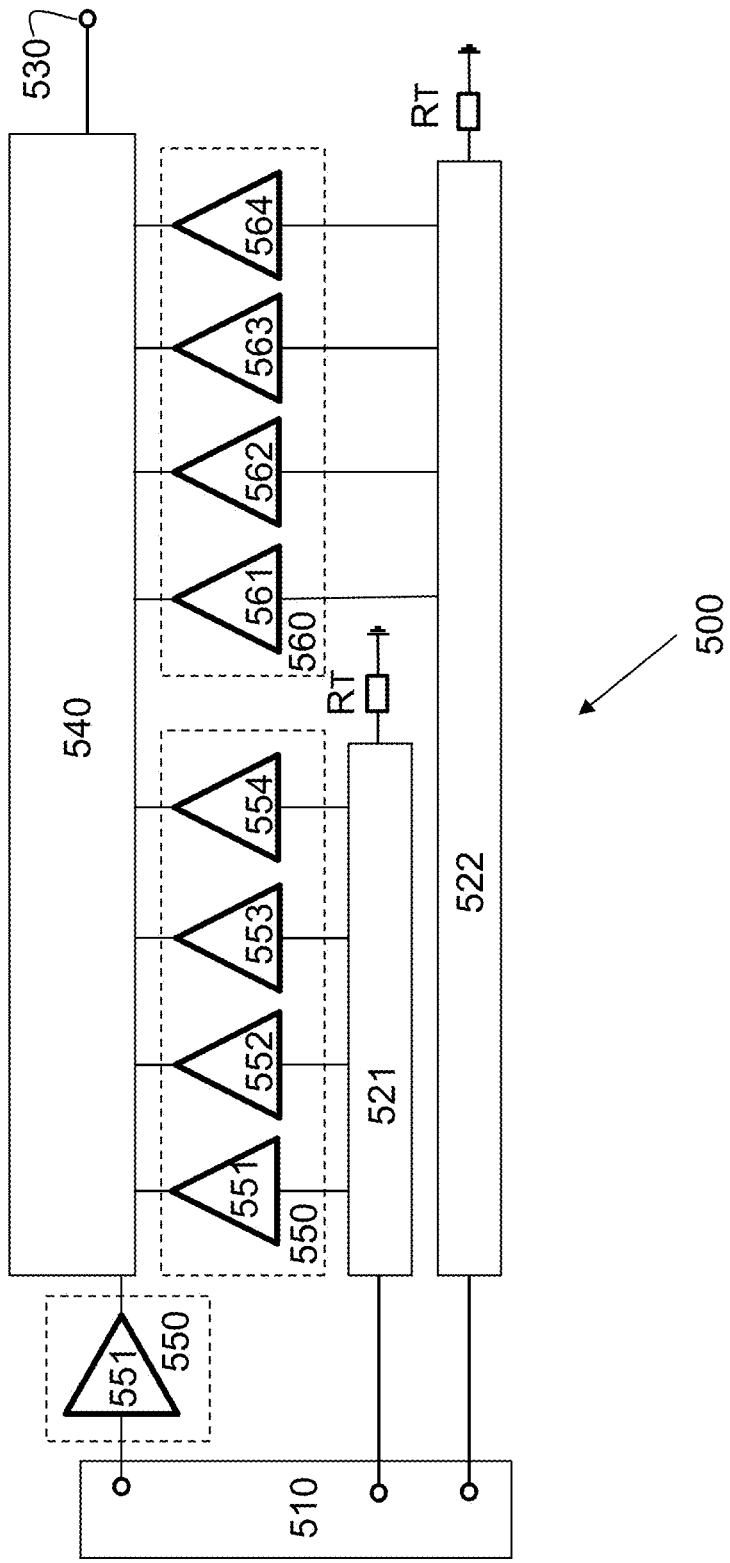
FIG. 5a is a schematic block diagram illustrating one example of a power amplifier module according to embodiments herein.

According to some embodiments herein, any one of the plurality of amplifier modules 111, 211, 311, 411, 121, 131, 1i1 . . . may comprise a power amplifier 500 as shown in FIG. 5a. The power amplifier 500 comprises an input port 510 for receiving the input signal and an output port 530 for providing an output signal. The inputs of the sub-amplifiers in each set are coupled, or connected, to the input port 110, either via an input transmission line 521, 522 or any other means (not shown).

The power amplifier 500 further comprises an output transmission line 540 coupled to the output port 530 of the power amplifier 500 and multiple sets of sub-amplifiers 550, 560 distributed along the output transmission line 540. The outputs of the multiple sets of sub-amplifiers 550, 560 are coupled to the output transmission line 540.

Figure 5B:
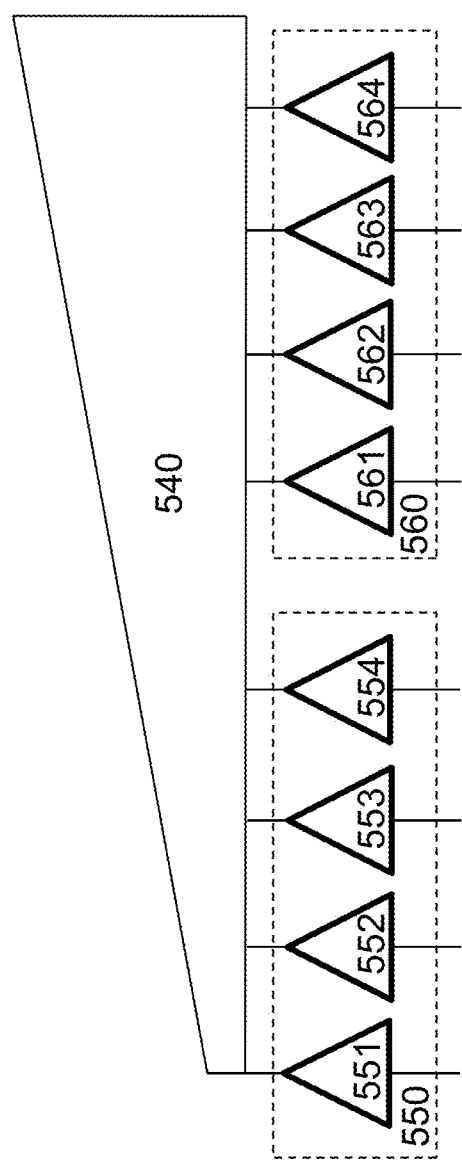
FIG. 5b is a schematic block diagram illustrating one example of the power amplifier module shown in FIG. 5a, FIG. 5c is a schematic block diagram illustrating one example of the power amplifier module shown in FIG. 5a together with diagrams showing supply voltages for the sub-amplifiers.

According to some embodiments herein, the output transmission line 540 has higher impedance at the beginning and decreased impedance towards the output port 530, as shown in FIG. 5b. In this embodiment, the sub-amplifiers are located along a tapered, usually synthetic or partly synthetic, transmission line 540 that has a higher characteristic impedance coming in, i.e. at the beginning of the transmission line 540, than going out, i.e. at the end of the transmission line 540. The supply voltages to the sub-amplifiers 550, 560 are equal in this embodiment. The detailed design for this embodiment can be found in patent application PCT/SE2015/050529.

Due to different characteristic impedances along the output transmission line 540 and equal supply voltages to the sub-amplifiers 551-554, 561-564, the output currents of the sub-amplifiers 551-554, 561-564 are thus weighted to correspond to the local decrease in characteristic impedance along the output transmission line 540. Since the amplifier module in the previous section also work in the same way, the ratio between the impedance of the output transmission line of the amplifier module in different sections is related to the ratio between the incoming power and the maximum output power of the amplifier module in different sections. In the example illustrated in FIG. 3, this would be 2P vs. 1P. So the characteristic impedance at the end of the transmission line 540 in the amplifier module in one section is half of the characteristic impedance at the beginning of the transmission line 540 in the amplifier module in the next section. The output transmission line 540 in the amplifier module in one section is thus simply split in equal parts, each having the same impedance and each carrying a power of maximum P, to provide incoming signal to the amplifier modules in the next section.

In the example illustrated in FIG. 4, this would be 3P vs. 1P. This means that the characteristic impedance at the end of the transmission line 540 in the amplifier module in the second section is one third of the characteristic impedance at the beginning of the transmission line 540 in the amplifier module in the next section. The output transmission line 540 in the amplifier module in the $2^{nd}$ section is thus simply split in three equal parts, each having the same impedance and each carrying a power of maximum P, to provide incoming signal to the amplifier modules in the next section.

Figure 5C:
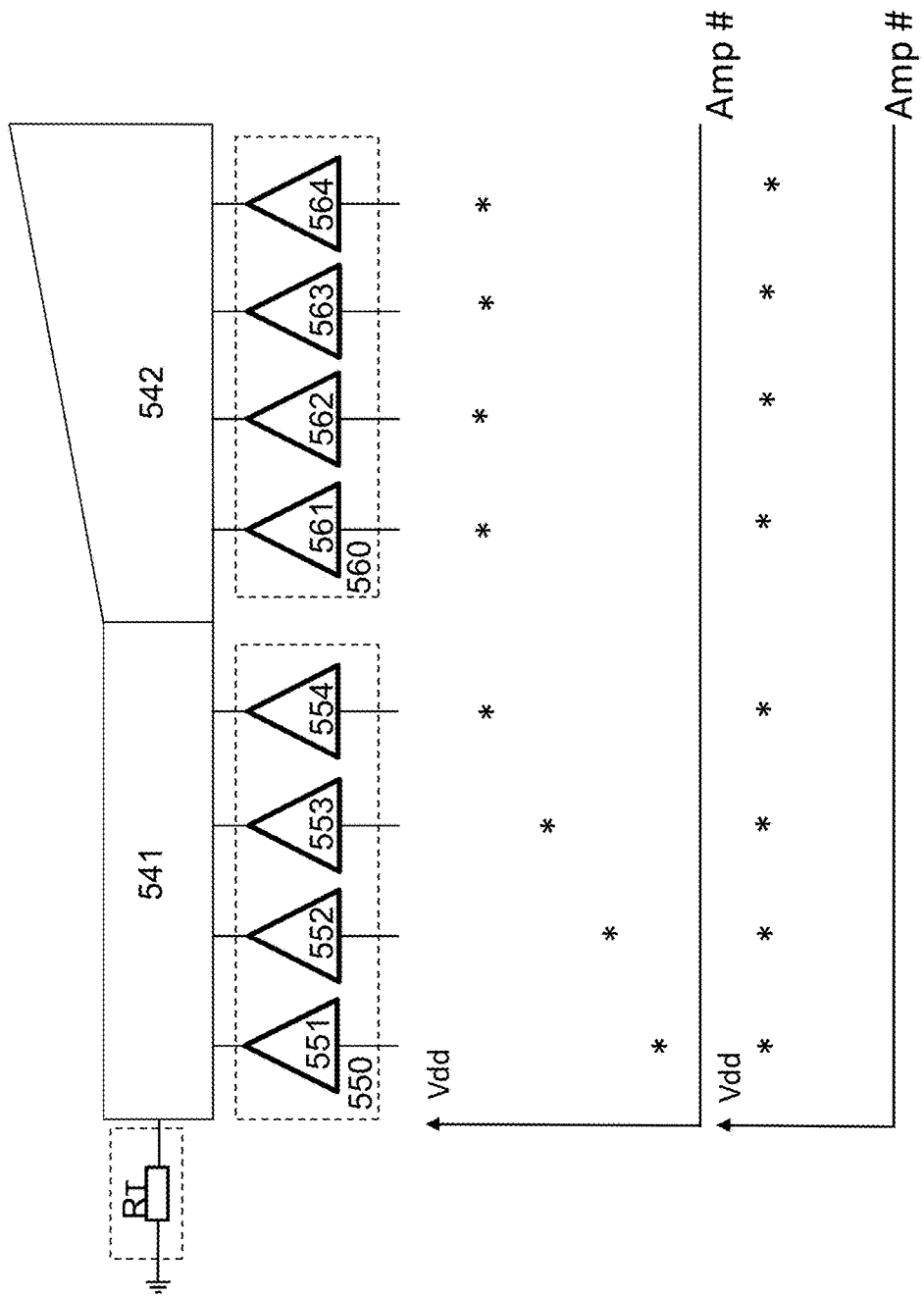

According to some embodiments herein, the power amplifier 500 comprises two sets of sub-amplifiers 550, 560 distributed along the output transmission line 540, as shown in FIG. 5c. A first set of sub-amplifiers 550 comprises one or more sub-amplifiers 551-554 and distributed along a first part of the output transmission line 541 having uniform impedance. A second set of sub-amplifiers 560 comprises at least two sub-amplifiers 561-564 distributed along a second part of the output transmission line 542 having higher impedance at the beginning and decreased impedance towards the output port 530. The supply voltages to the sub-amplifiers 151-554 in the first set 550 are configured to be increased gradually along the first part of the output transmission line 541 towards the output port 530 to be the same value as a supply voltage to the second set of sub-amplifiers 560.

To maximize or improve the efficiency, the supply voltages to the sub-amplifiers 551-554 are reduced compared to the normal maximum supply voltage or compared to supply voltages to other sub-amplifiers 561-564, referred to as "depressed supply voltages", to accommodate only the local maximum output voltage swing at these sub-amplifiers. These depressed supply voltages are generally increasing in the forward direction along the output transmission line towards the output port 530, as shown in the middle part of the diagram in FIG. 5c, where the supply voltage Vdd verses the sub-amplifiers numbers Amp #, is shown. The detailed design for this embodiment with different alternatives can be found in patent application PCT/SE2015/051134.

According to some embodiments, a seed part may be implemented into every amplifier module. For example, in the amplifier module 500 shown in FIG. 5c, the first set of sub-amplifiers 550 may work as a seed part. As shown in FIG. 5c, the seed part's, i.e. the first set of sub-amplifiers 550 comprises sub-amplifiers 551-554 distributed along the first part of the output transmission line marked with 541, and the power-add part's, i.e. the second set of sub-amplifiers 560 comprises at least two sub-amplifiers 561-564 distributed along the second part of the output transmission line marked with 542. In order to have the correct input characteristic impedance for the power-add part, the seed part has preferably a uniform impedance output transmission line. Since the seed part has uniform impedance, it uses the depressed supply voltage scheme for high efficiency, as seen in the middle part of the diagram. The first section would then perform both the function of seed and first power-add section. As indicated, the first set of amplifier modules can be backwards terminated with an input side resistor $R_T$.

When the amplifier module 500 is used in exclusive power-add mode, the seed part can for example be inactivated, i.e. have no drive signal. Since the maximum incoming signal voltage can be full-swing, to avoid voltage breakdown the supply voltages to the inactive sub-amplifiers 551-554 may need to be kept as high as those for the power-add section, as indicated in the lowermost part of the diagram, where the supply voltage Vdd verses the sub-amplifiers numbers Amp # is shown.

Therefore according to some embodiments herein, the first set of sub-amplifiers 550 may be configured to be inactivated and their supply voltages may be set to the same as the supply voltage to the second set of sub-amplifier 560.

The amplifier module 500 may alternatively be built entirely with the depressed supply voltage scheme. In a standard design, the characteristic impedance throughout the sub-amplifiers 551-554, 561-564 is then uniform, and different sets of supply voltages are used for the amplifier modules in different sections. Since the output is split to provide incoming signal to the next section, this means that impedance transformation between sections is necessary in this case. For example, a split from an output characteristic impedance Z to two inputs that each have impedance Z means an impedance transformation from Z to Z/2 is necessary between the sections.

Some advantages may be concluded from the described embodiments above. For example, building techniques described according to embodiments herein provide improved power addition and combination in respect of bandwidth and efficiency, and can be used to build power amplifiers with high efficiency in wide amplitude ranges and over arbitrarily large relative bandwidths. The power amplifier system 100, 200, 300, 400 according to the embodiments herein can provide scalable output power and has modularity. Using this building system, a plurality of amplifier modules can be connected in expanding patterns and the same type of amplifier module may be reused. Further, the range of characteristic output impedance within an amplifier module may be reduced, because the difference between the highest and lowest impedance level for an on-chip output transmission line of each amplifier module is lower for a single section than for a succession. The lowering of output impedance is counteracted by the splitting of outgoing power or output signal, which increases impedance. For example, a non-reflective split of the output power 2P into P requires the output transmission line be split into 2 transmission lines, each will have twice of the impedance. The modular power amplifier system 100, 200, 300, 400 may also retain the large bandwidth of the individual amplifier modules without any extra design effort. For example, Even though embodiments of the various aspects have been described, many different alterations, modifications and the like thereof will become apparent for those skilled in the art. For example, for increased granularity in output power, two or more modular power amplifier system with different numbers of sections may be paralleled at the outputs of the final sections, or at some intermediate sections. For example, the modular power amplifier system 200 with 8P output power may be parallel with the modular power amplifier system 400 with 12P output power, and yield 20P total output power. For example, if higher output powers are required without requirements for high efficiency for the input signal amplitudes below a certain level, the amplifier modules in the first section for the lowest input signal amplitude ranges may be combined into other sections by providing the same drive signals to several sections.

Further, instead of having several different power-add modules with the same maximum incoming power P and different outgoing maximum power, it may also to have an equal outgoing maximum power P for several different amplifier modules, but with different incoming power with a fraction of 1/x with respect to P.

A versatile power amplifier system 100, 200, 300, 400 may also be built with amplifier modules with different maximum input powers so that the maximum output power of an amplifier module matches the maximum incoming power to another amplifier module. Some the amplifier system 100, 200, 300, 400 would then only need a single chip per module per section. The amplifier modules in different sections may have one or several output/input power relations, not necessarily have the same for all input powers.

Due to the expanding pattern of the amplifier chips or modules in the sections, the amplifier modules in the next section may preferably be oriented radially outward from the originating amplifier module in the previous section. A radial geometry can be put in a conical shape by wrapping it around a central axis.

The described embodiments are therefore not intended to limit the scope of the present disclosure.

Figure 6:
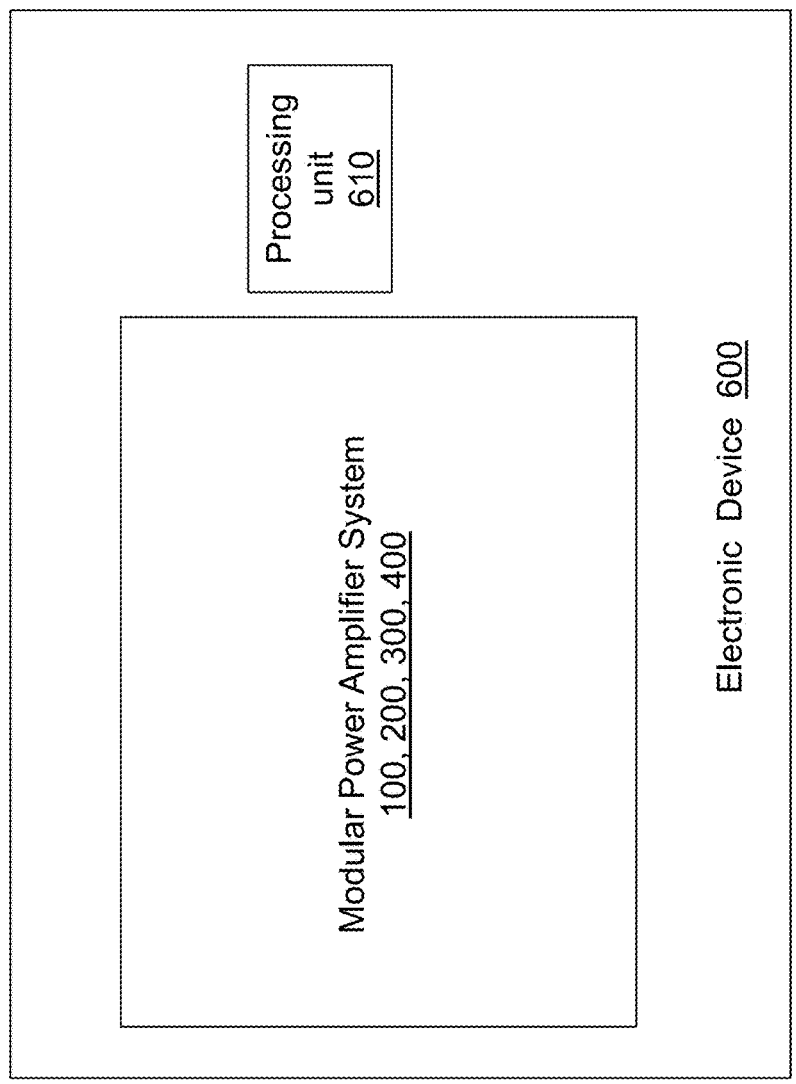
FIG. 6 is a block diagram showing an electronic device in which the modular power amplifier system according to embodiments herein may be implemented.

The modular power amplifier system 100, 200, 300, 400 according to embodiments herein may be employed in various electronic devices. FIG. 6 shows a block diagram for an electronic device 600, which may be, e.g. a radio frequency transceiver, a wireless communication device, a user equipment, a mobile device, a base station or a radio network node etc. in a wireless communication systems, or any general electronic circuit or equipment which needs a power amplifier. The electronic device 600 may comprise other units, where a processing unit 610 is shown.

When using the word "comprise" or "comprising" it shall be interpreted as non-limiting, i.e. meaning "consist at least of".

The embodiments herein are not limited to the above described embodiments. Various alternatives, modifications and equivalents may be used. Therefore, the above embodiments should not be taken as limiting the scope of the invention, which is defined by the appending claims.

The invention claimed is:

1. A modular power amplifier system for receiving an input signal and providing output signals with scalable output power, wherein the modular power amplifier system comprises:
   a plurality of amplifier modules, each amplifier module comprises an input port and an output port, and wherein the plurality of amplifier modules are arranged into a number of sections comprising:
   a first section which comprises a first amplifier module, among the plurality of amplifier modules, configured to receive the input signal within a first amplitude range and provide an output signal having a first output power;
   a second section which comprises a second amplifier module, among the plurality of amplifier modules, configured to receive the input signal within a second amplitude range and provide an output signal having a second output power; and
   an i-th section which comprises multiple amplifier modules, among the plurality of amplifier modules, each being configured to receive the input signal within a certain amplitude range and provide an output signal having a certain output power, and wherein
   the output signal of the first amplifier module is combined with the output signal of the second amplifier module and the output signal of each amplifier module in the -th section is split and each split output signal is combined with the respective output signal of the amplifier modules in the i-th section, wherein i=3, 4, . . . .

2. The modular power amplifier according to claim 1, wherein the second amplifier module in the second section is of a same type as the first amplifier module in the first section.

3. The modular power amplifier according to claim 1, wherein the amplifier module in the i-th section is of a same type as the amplifier module in a previous section.

4. The modular power amplifier system according to claim 1, wherein each amplifier module in different sections is a unity module which has same characteristic and output power and is implemented on a chip for operating in a certain frequency range.

5. The modular power amplifier system according to claim 1, wherein amplifier modules in different sections are of a same type of power amplifier module.

6. The modular power amplifier system according to claim 1, wherein the amplifier module in the first section is a first type of power amplifier chip and amplifier modules in other sections are a second type of power amplifier chip.

7. The modular power amplifier system according to claim 1, wherein the amplifier module in different sections are different type of power amplifier chips.

8. The modular power amplifier system according to claim 1, wherein the first amplifier module in the first section is any one of power amplifier chips available on the market.

9. The modular power amplifier system according to claim 1, wherein the first amplifier module in the first section is inactivated.

10. The modular power amplifier system according to claim 1, wherein any one of the plurality of amplifier modules comprises:
    a power amplifier having an input port for receiving the input signal and an output port for providing an output signal; and wherein the power amplifier comprises:
    an output transmission line coupled to the output port of the power amplifier; and
    multiple sets of sub-amplifiers distributed along the output transmission line, wherein inputs of the multiple sets of sub-amplifiers are coupled to the input port, and outputs of the multiple sets sub-amplifiers are coupled to the output transmission line.

11. The modular power amplifier system according to claim 10, wherein the output transmission line has higher impedance at the beginning and decreased impedance towards the output port.

12. The modular power amplifier system according to claim 10, wherein the power amplifier comprises:
    two sets of sub-amplifiers distributed along the output transmission line; and wherein
    a first set of sub-amplifiers comprises one or more sub-amplifiers and distributed along a first part of the output transmission line having uniform impedance;
    a second set of sub-amplifiers comprises at least two sub-amplifiers distributed along a second part of the output transmission line having higher impedance at the beginning and decreased impedance towards the output port; and wherein
    supply voltages to the sub-amplifiers in the first set are configured to be increased gradually along the first part of the output transmission line towards the output port to be a same value as a supply voltage to the second set of sub-amplifiers.

13. The modular power amplifier system according to claim 12, wherein the first set of sub-amplifiers are configured to be inactivated and their supply voltages are set to the same as the supply voltage to the second set of sub-amplifiers.

14. An electronic device comprising a modular power amplifier system according to claim 1.

* * * * *

UNITED STATES PATENT AND TRADEMARK OFFICE
CERTIFICATE OF CORRECTION

PATENT NO. : 10,116,265 B2
APPLICATION NO. : 15/102808
DATED : October 30, 2018
INVENTOR(S) : Hellberg It is certified that error appears in the above-identified patent and that said Letters Patent is hereby corrected as shown below:

In the Specification

In Column 6, Line 13, delete "$1^{st}$, $3^{rd}$" and insert -- $1^{st}$, $2^{nd}$, $3^{rd}$ --, therefor.

In the Claims

In Column 11, Line 50, in Claim 1, delete "the -th" and insert -- the i-th --, therefor.

In Column 11, Line 54, in Claim 2, delete "amplifier according" and insert -- amplifier system according --, therefor.

In Column 11, Line 58, in Claim 3, delete "amplifier according" and insert -- amplifier system according --, therefor.

In Column 12, Line 32, in Claim 10, delete "sets sub-amplifiers" and insert -- sets of sub-amplifiers --, therefor.

Signed and Sealed this
Ninth Day of April, 2019

Andrei Iancu
*Director of the United States Patent and Trademark Office*